(12) United States Patent
Vijayrao et al.

(10) Patent No.: US 11,437,114 B1
(45) Date of Patent: Sep. 6, 2022

(54) REDUCED ERROR CORRECTION CODE FOR DUAL CHANNEL DDR DYNAMIC RANDOM-ACCESS MEMORY

(71) Applicant: Meta Platforms, Inc., Menlo Park, CA (US)

(72) Inventors: Narsing Krishna Vijayrao, Santa Clara, CA (US); Christian Markus Petersen, Golden, CO (US)

(73) Assignee: Meta Platforms, Inc., Menlo Park, CA (US)

( * ) Notice: Subject to any disclaimer, the term of this patent is extended or adjusted under 35 U.S.C. 154(b) by 55 days.

(21) Appl. No.: 16/938,865

(22) Filed: Jul. 24, 2020

Related U.S. Application Data

(60) Provisional application No. 63/019,697, filed on May 4, 2020.

(51) Int. Cl.
*G11C 29/42* (2006.01)
*G11C 29/00* (2006.01)
*G11C 29/56* (2006.01)
*G11C 29/12* (2006.01)

(52) U.S. Cl.
CPC ........ *G11C 29/42* (2013.01); *G11C 29/12015* (2013.01); *G11C 29/56012* (2013.01); *G11C 29/824* (2013.01)

(58) Field of Classification Search
CPC . G11C 11/401; G11C 29/42; G11C 29/12015; G11C 29/56012; G11C 29/824
USPC ........................................................ 365/201
See application file for complete search history.

(56) References Cited

U.S. PATENT DOCUMENTS

| | | | |
|---|---|---|---|
| 2009/0327596 | A1 | 12/2009 | Christenson et al. |
| 2017/0199830 | A1* | 7/2017 | Nale .................... G11C 11/4096 |
| 2019/0188074 | A1* | 6/2019 | Coteus .................. G06F 11/108 |
| 2019/0227886 | A1* | 7/2019 | Glancy .................. G11C 29/42 |
| 2020/0075079 | A1 | 3/2020 | Kim et al. |

OTHER PUBLICATIONS

Kumar, What Exactly is DDR5 RAM? Features & Availability, Jan. 4, 2020 (Year: 2020).*
JEDEC, DDR5 Full Spec Draft Rev0.1 (Year: 2011).*
European Search Report for European Application No. 21166791.0, dated Sep. 29, 2021, 2 pages.
JEDEC, JEDEC Standard, DDR5 SDRAM, JESD79-5A, (Revision of JESD79-5, Jul. 2020), Oct. 2021, pp. 1-463.

(Continued)

*Primary Examiner* — Alfredo Bermudez Lozada
(74) *Attorney, Agent, or Firm* — Van Pelt, Yi & James LLP

(57) ABSTRACT

A first set of 64 bytes of data and a second set of 64 bytes of data are received. A first set of eight error-correcting code (ECC) bytes for the first set of 64 bytes of data and a second set of eight ECC bytes for the second set of 64 bytes of data are calculated. The first set of 64 bytes of data, the second set of 64 bytes of data, the first set of eight ECC bytes, and the second set of eight ECC bytes are sent to one or more $5^{th}$ generation double data rate (DDR5) synchronous dynamic random-access memory (SDRAM) modules through a DDR5 dual-channel in a single burst, wherein the DDR5 dual-channel comprises a first data channel and a second data channel, and wherein the first data channel and the second data channel are driven by a same clock signal.

20 Claims, 10 Drawing Sheets

(56) References Cited

OTHER PUBLICATIONS

Schlachter S, et al., "Introducing Micron® DDR5 SDRAM: More than a Generational Update," XP055844818, May 31, 2019, 6 pages. Retrieved from the Internet: URL:https://www.micron.com/-/media/client/global/documents/products/white-paper/ddr5_more_than_a_generational_update_wp.pdf?la=en on Sep. 27, 2021.

\* cited by examiner

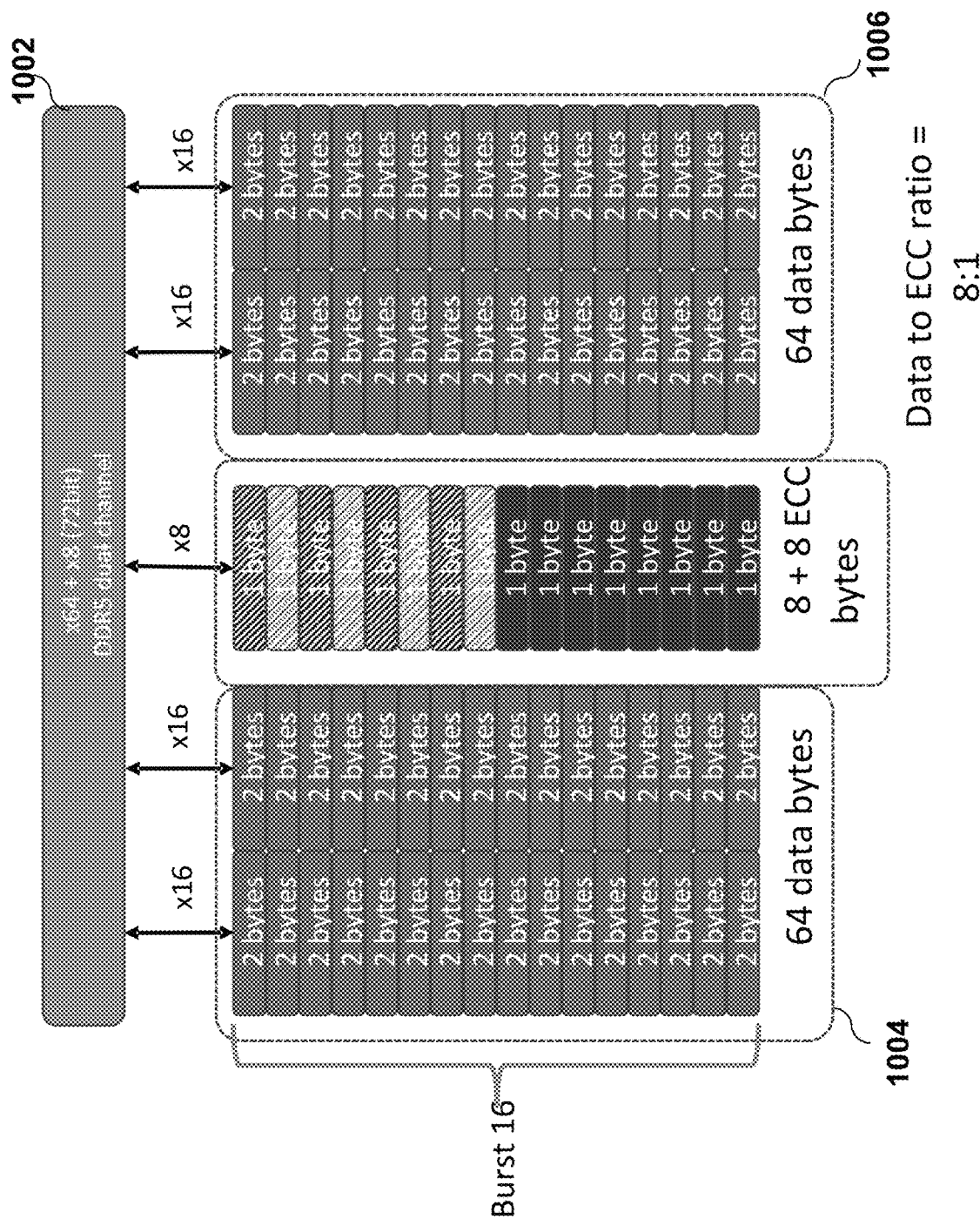

REDUCED ERROR CORRECTION CODE FOR DUAL CHANNEL DDR DYNAMIC RANDOM-ACCESS MEMORY

CROSS REFERENCE TO OTHER APPLICATIONS

This application claims priority to U.S. Provisional Patent Application No. 63/019,697 entitled REDUCED ERROR CORRECTION CODE FOR DUAL CHANNEL DDR DYNAMIC RANDOM-ACCESS MEMORY filed May 4, 2020 which is incorporated herein by reference for all purposes.

BACKGROUND OF THE INVENTION

An error-correcting code (ECC) is used for controlling errors in data over unreliable or noisy communication channels. A sender may encode a message with redundant information in the form of an ECC. The redundancy allows the receiver to detect a limited number of errors that may occur anywhere in the message, and often to correct these errors without retransmission. The term ECC covers any types of ECC, including block codes, convolutional codes, and the like. ECC may be used to protect the data stored in a memory device.

Double Data Rate Synchronous Dynamic Random-Access Memory (DDR SDRAM) is a double data rate (DDR) synchronous dynamic random-access memory (SDRAM) class of memory integrated circuits used in computers. As dynamic random-access memory (DRAM) continues to increase in density and interface speeds continue to increase, the memory industry is transitioning from the $4^{th}$ generation DDR4 to the $5^{th}$ generation DDR5 industry standard.

FIG. 1 illustrates a block diagram in which a memory controller 104 is used to access a group of DRAM modules 108. Memory controller 104 sends and receives data that flows between a processor and the processor's DRAM memory 108. The processor may be a central processing unit (CPU) or an accelerator. DRAM memory 108 may be any DDR SDRAM memory, such as a DDR4 or DDR5 SDRAM memory.

In some embodiments, memory controller 104 is integrated into another chip 102. For example, the memory controller 104 may be placed on the same die or integrated as an integral part of a processor (e.g., a CPU or an accelerator). In another example, the memory controller 104 may be placed on the same die or integrated as part of an application-specific integrated circuit (ASIC), and the ASIC may be connected to a processor through an interconnect, such as Compute Express Link (CXL) or PCI Express (PCIe).

Memory controller 104 is a digital circuit that manages the flow of data going to and from the DRAM memory 108. Memory controller 104 contains the logic necessary for many different functions, including the logic to read and write to the DRAMs and also the logic to refresh the DRAMs. Memory controller 104 may also include the logic for error detection and correction. Memory controller 104 includes a memory physical interface (PHY) block 106. PHY block 106 includes the logic for connecting to the external DRAM memory 108. In some embodiments, the DDR PHY Interface (DFI) is used as an interface protocol that defines the signals, timing, and programmable parameters required to transfer control information and data to and from the DRAM devices and between the memory controller 104 and the PHY block 106.

DDR4 and DDR5 have different dual in-line memory module (DIMM) channel architectures. A DIMM comprises a series of DRAM integrated circuits. These modules are mounted on a printed circuit board and designed for use in personal computers, workstations, and servers. FIG. 2 illustrates an embodiment of a DDR4 channel. FIG. 3 illustrates an embodiment of a traditional DDR5 channel.

With reference to FIGS. 2 and 3, one of the changes as part of the transition from DDR4 to DDR5 is that the prefetch depth in the DRAMs, and therefore the burst length, has been increased from 8 to 16. With reference to FIG. 2, DDR4 has a prefetch depth of 8 n, and the basic burst size is eight words. Prefetch depth is the number of words of data that are fetched every time a column command is performed with DDR memories. Burst length is the amount of data transferred between the processor and its memory in each transmission. Because the core of the DRAM is much slower than the interface, the difference is bridged by accessing information in parallel and then serializing it out the interface. For example, DDR4 prefetches eight words, which means that every time a read or a write operation is performed, it is performed on eight words of data, and bursts out of, or into, the SDRAM over four clock cycles on both clock edges, for a total of eight consecutive operations. With reference to FIG. 3, DDR5 has a prefetch depth of 16 n, and the basic burst size is 16 words. A burst length of 16 allows a single burst to access 64 bytes of data, which is the typical CPU cache line size. DDR5 achieves this by using only one of the two independent channels.

Typically, the cache line size for different devices (e.g., central processing units (CPUs) or other processors) is 64 bytes. To allow for 64 byte accesses to match a cache line size of 64 bytes, the bus width in DDR4 (see FIG. 2) is 72 bits, with 64 data bits and eight error-correcting code (ECC) bits. In other words, DDR4 DIMMs have a 72-bit bus, comprising 64 data bits and eight ECC bits.

In order to continue to allow for 64 byte accesses to match a cache line size of 64 bytes, the bus width in DDR5 (see FIG. 3) is changed to 40 bits, with 32 data bits and eight ECC bits. In other words, each DIMM has two 40-bit DDR5 channels, and each channel has 32 data bits and eight ECC bits. With two DDR5 channels, the total data width is 2*32 data bits=64-bits total, which is the same as DDR4. However, having two smaller independent channels improves memory access efficiency. In addition, each of the 40-bit DDR5 channels has its own independent clock, address, or control signals.

The side-effect of this change is that for every 64 bytes of data, the amount of ECC data has increased from eight ECC bytes to 16 ECC bytes. In other words, the number of ECC bytes has doubled. The data to ECC ratio, i.e., the amount of actual data over the amount of ECC data, is decreased from 8:1 to 4:1. The increased ECC overhead adds additional cost and power consumption to server systems.

FIG. 4 illustrates an embodiment in which DDR5 SDRAM memories are accessed using traditional DDR5 channels. FIG. 5 illustrates an embodiment of a traditional DDR5 memory controller 404.

As shown in FIG. 4, two independent memory controllers (404 and 406) integrated into chip 402 are used to access two groups of DRAMs (408 and 410) independently. The DDR5 channel between memory controller 404 and its group of DRAMs and the DDR5 channel between memory controller 406 and its group of DRAMs are independent from each other. Each of the channels has its own independent clock, and the address and control signals for the channel are aligned to the channel's clock.

As shown in FIG. 5, each of the memory controllers (e.g., memory controller 404 or memory controller 406) includes, among other modules, a data engine 502, an ECC engine 504, and a PHY block 506. For each 64 bytes of data transferred from the processor to the data engine 502, the ECC engine 504 computes 16 ECC bytes, corresponding to the 64 bytes of data. The 64 bytes of data and the 16 ECC bytes, a total of 80 bytes, are sent to the DRAMs by a single independent clock over a burst of 16 words.

BRIEF DESCRIPTION OF THE DRAWINGS

Various embodiments of the invention are disclosed in the following detailed description and the accompanying drawings.

FIG. 10 illustrates another embodiment of an improved DDR5 dual-channel.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 6:
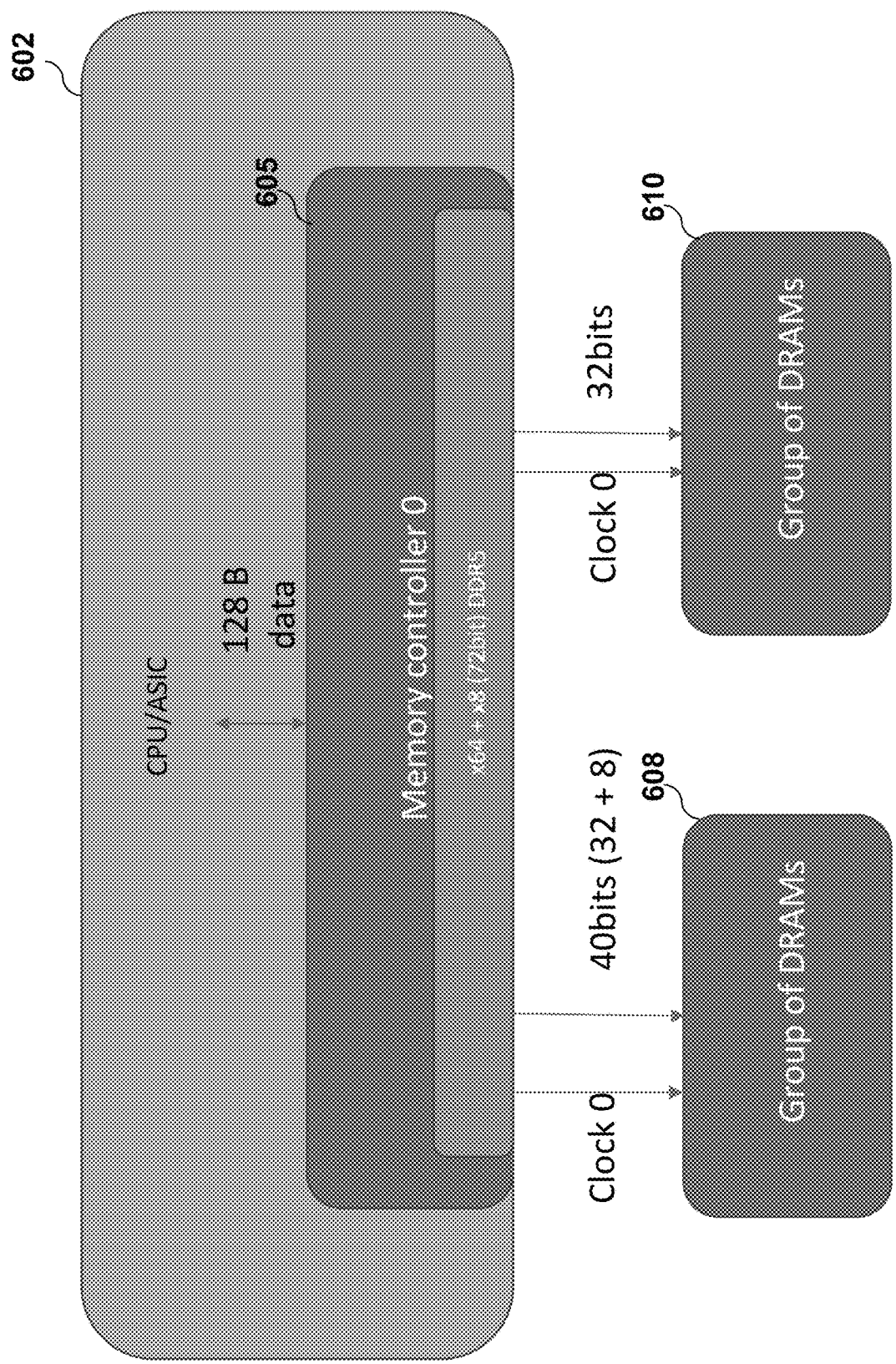
FIG. 6 illustrates an embodiment in which DDR5 SDRAM memories are accessed using improved DDR5 channels.
Figure 7:
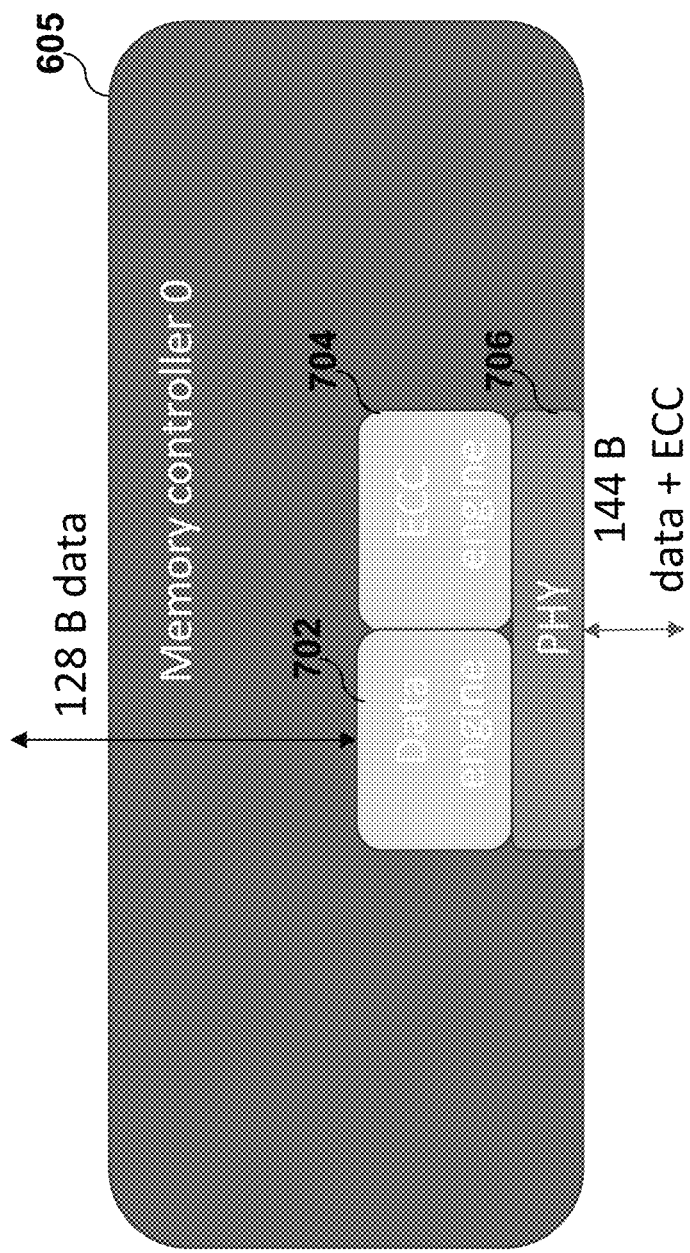
FIG. 7 illustrates an embodiment of an improved DDR5 memory controller 605.

FIG. 6 illustrates an embodiment in which DDR5 SDRAM memories are accessed using improved DDR5 channels. FIG. 7 illustrates an embodiment of an improved DDR5 memory controller 605.

As shown in FIG. 6, a single improved memory controller 605 integrated into a chip 602 is used to access two groups of DRAMs (608 and 610). The two DDR5 channels between memory controller 605 and their corresponding groups of DRAMs are no longer independent from each other. The two DDR5 channels have timing dependency because each of the channels is driven by the same clock signal in lockstep, and the address and control signals for the channels are aligned to the same clock domain. As a result, the two groups of DRAMs (608 and 610) are no longer independent from each other. Reading and writing of the DRAMs are performed on the same clock, and the two groups of DRAMs need to be accessed in lockstep. Therefore, while the two groups of DRAMs may be physically separate groups of DRAMs, logically they belong to the same group of DRAMs.

As shown in FIG. 7, an improved memory controller 605 includes, among other modules, a data engine 702, an ECC engine 704, and a PHY block 706. An error-correcting code (ECC) is used for controlling errors in data over unreliable or noisy communication channels. A sender may encode a message with redundant information in the form of an ECC. The redundancy allows the receiver to detect a limited number of errors that may occur anywhere in the message, and often to correct these errors without retransmission. The term ECC covers any types of ECC, including block codes, convolutional codes, and the like. ECC engine 704 provides error correction to the data by generating the ECC bytes for the data and sending the ECC bytes to PHY block 706. For each 128 bytes of data transferred from the processor to the data engine 702, the ECC engine 704 computes 16 ECC bytes corresponding to the 128 bytes of data. The 128 bytes of data and the 16 ECC bytes, a total of 144 bytes, are sent to the DRAMs by a single independent clock over a burst of 16 words.

Figure 8:
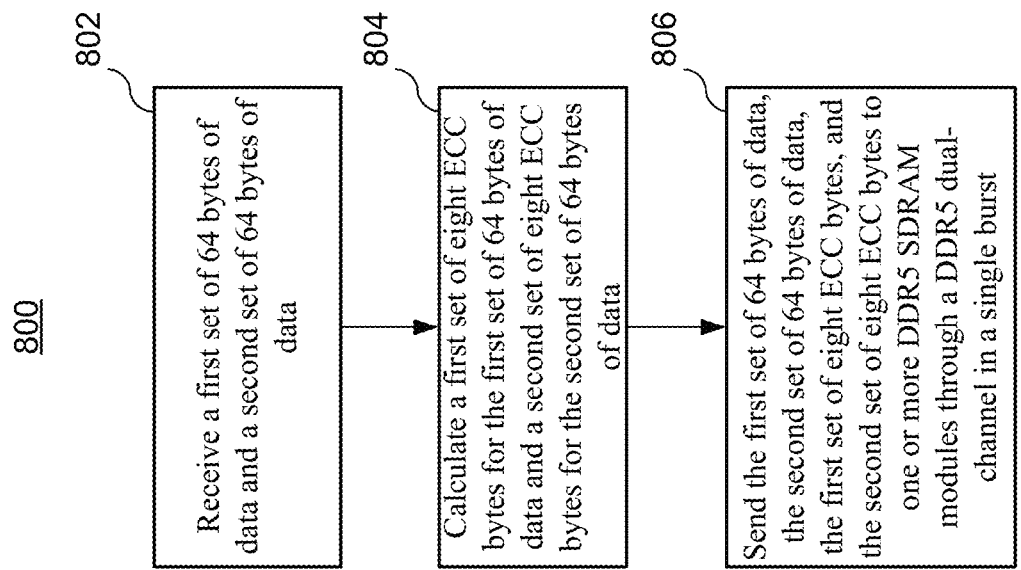
FIG. 8 illustrates an embodiment of a process 800 for sending data to one or more 5th generation double data rate (DDR5) synchronous dynamic random-access memory (SDRAM) modules by a memory controller.

FIG. 8 illustrates an embodiment of a process 800 for sending data to one or more 5th generation double data rate (DDR5) synchronous dynamic random-access memory (SDRAM) modules by a memory controller. At step 802, a first set of 64 bytes of data and a second set of 64 bytes of data are received. At step 804, a first set of eight error-correcting code (ECC) bytes for the first set of 64 bytes of data and a second set of eight ECC bytes for the second set of 64 bytes of data are calculated. At step 806, the first set of 64 bytes of data, the second set of 64 bytes of data, the first set of eight ECC bytes, and the second set of eight ECC bytes are sent to one or more $5^{th}$ generation double data rate (DDR5) synchronous dynamic random-access memory (SDRAM) modules through a DDR5 dual-channel in a single burst. The DDR5 dual-channel comprises a first data channel and a second data channel, and wherein the first data channel and the second data channel are driven by a single clock signal.

Figure 1:
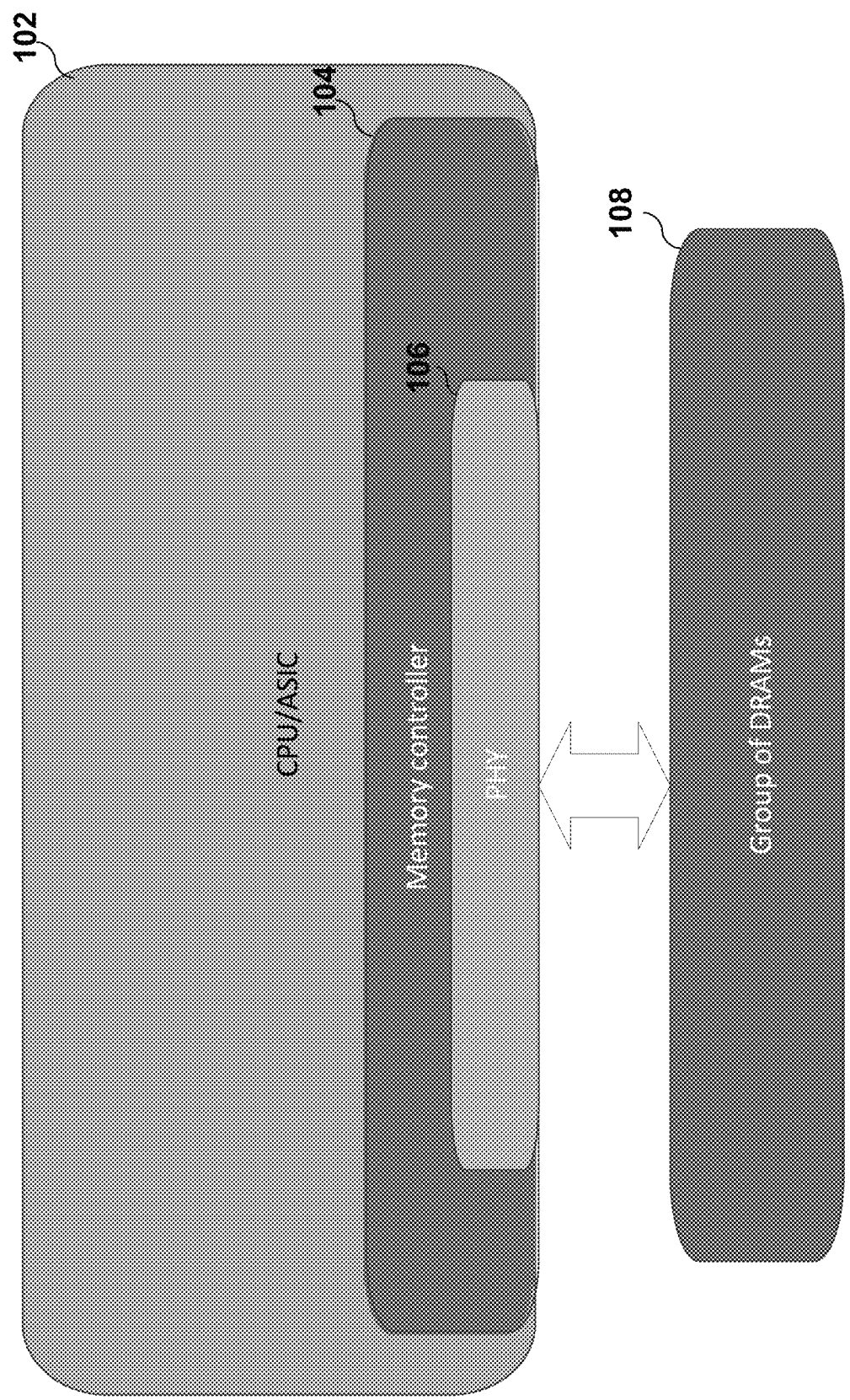
FIG. 1 illustrates a block diagram in which a memory controller 104 is used to access a group of DRAMs 108.
Figure 2:
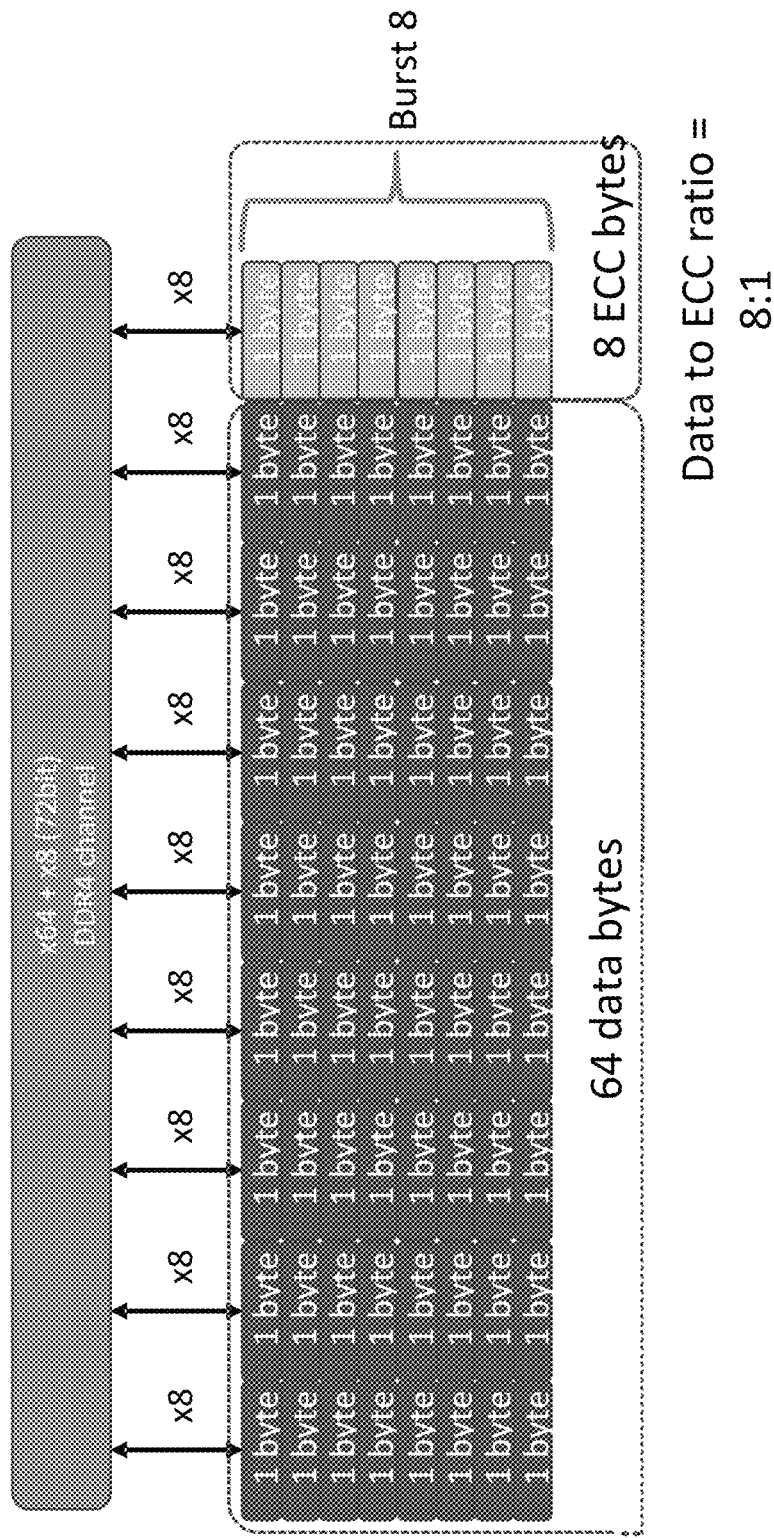
FIG. 2 illustrates an embodiment of a DDR4 channel.
Figure 3:
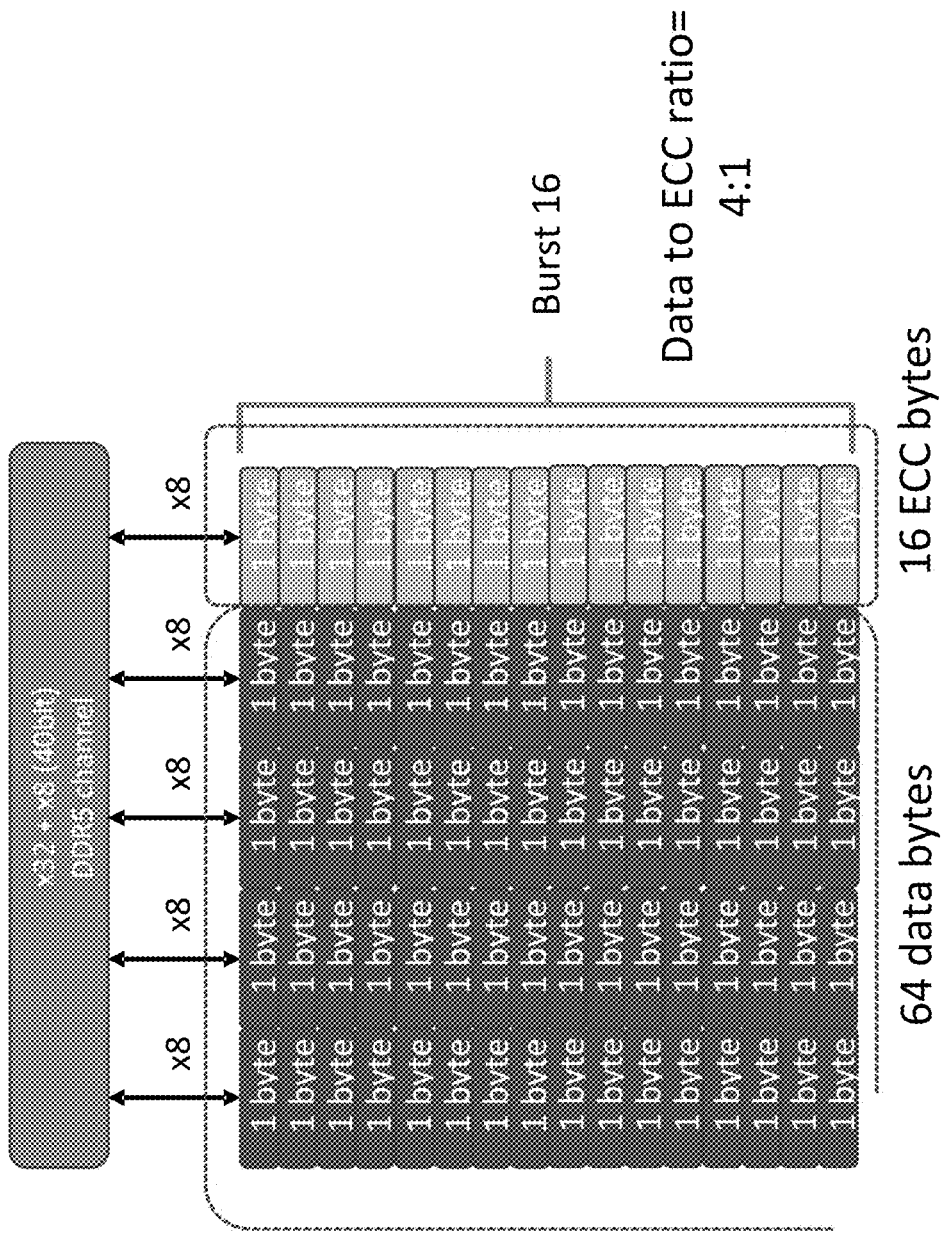
FIG. 3 illustrates an embodiment of a traditional DDR5 channel.
Figure 4:
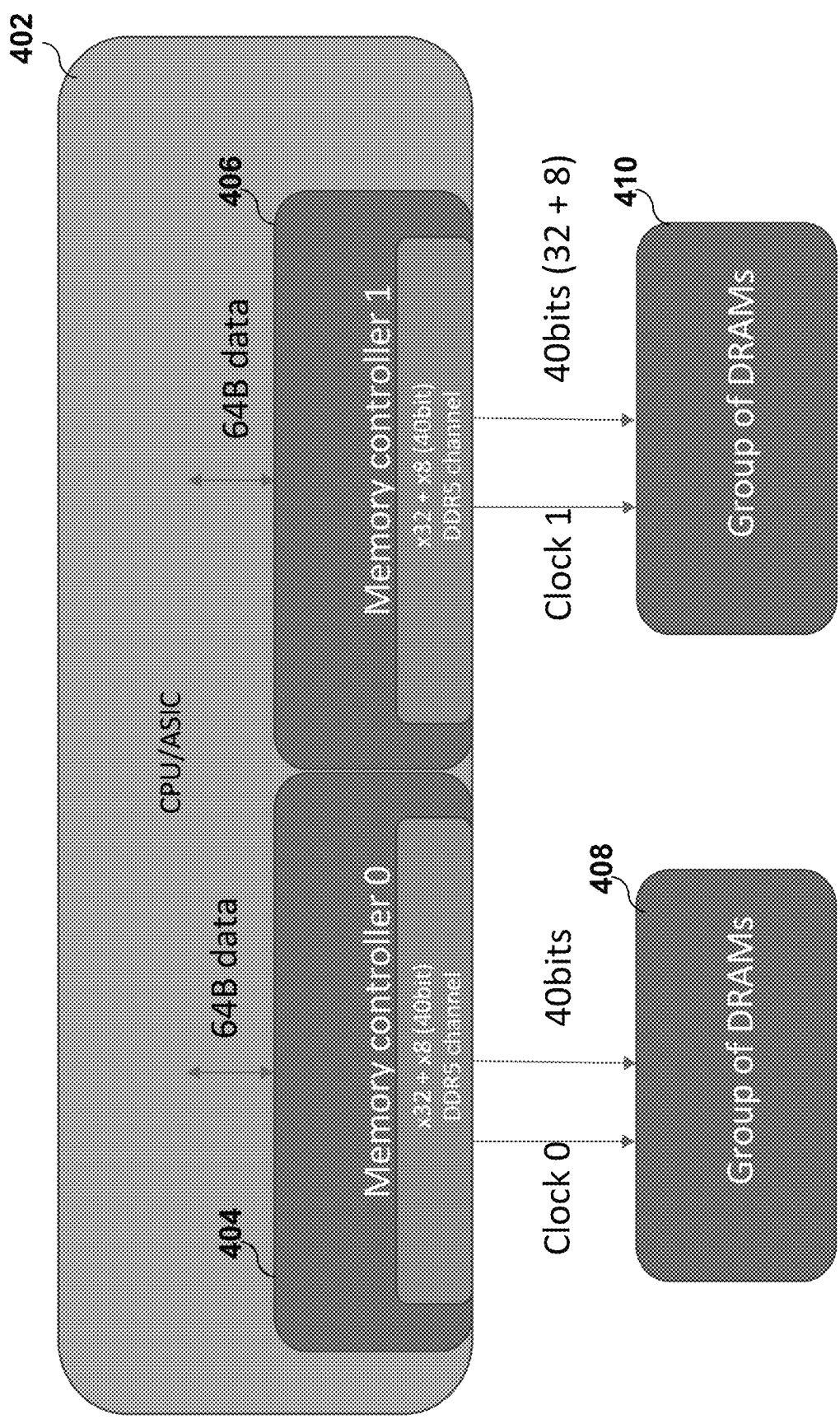
FIG. 4 illustrates an embodiment in which DDR5 SDRAM memories are accessed using traditional DDR5 channels.
Figure 5:
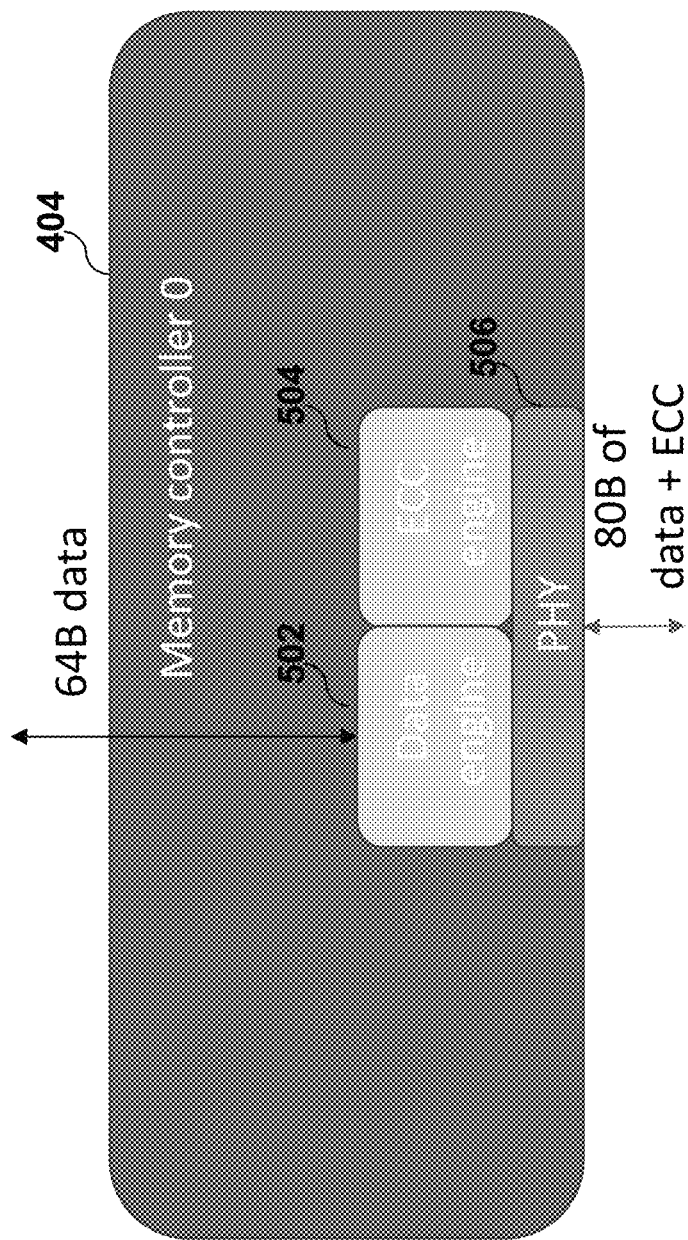
FIG. 5 illustrates an embodiment of a traditional DDR5 memory controller 404.
Figure 9:
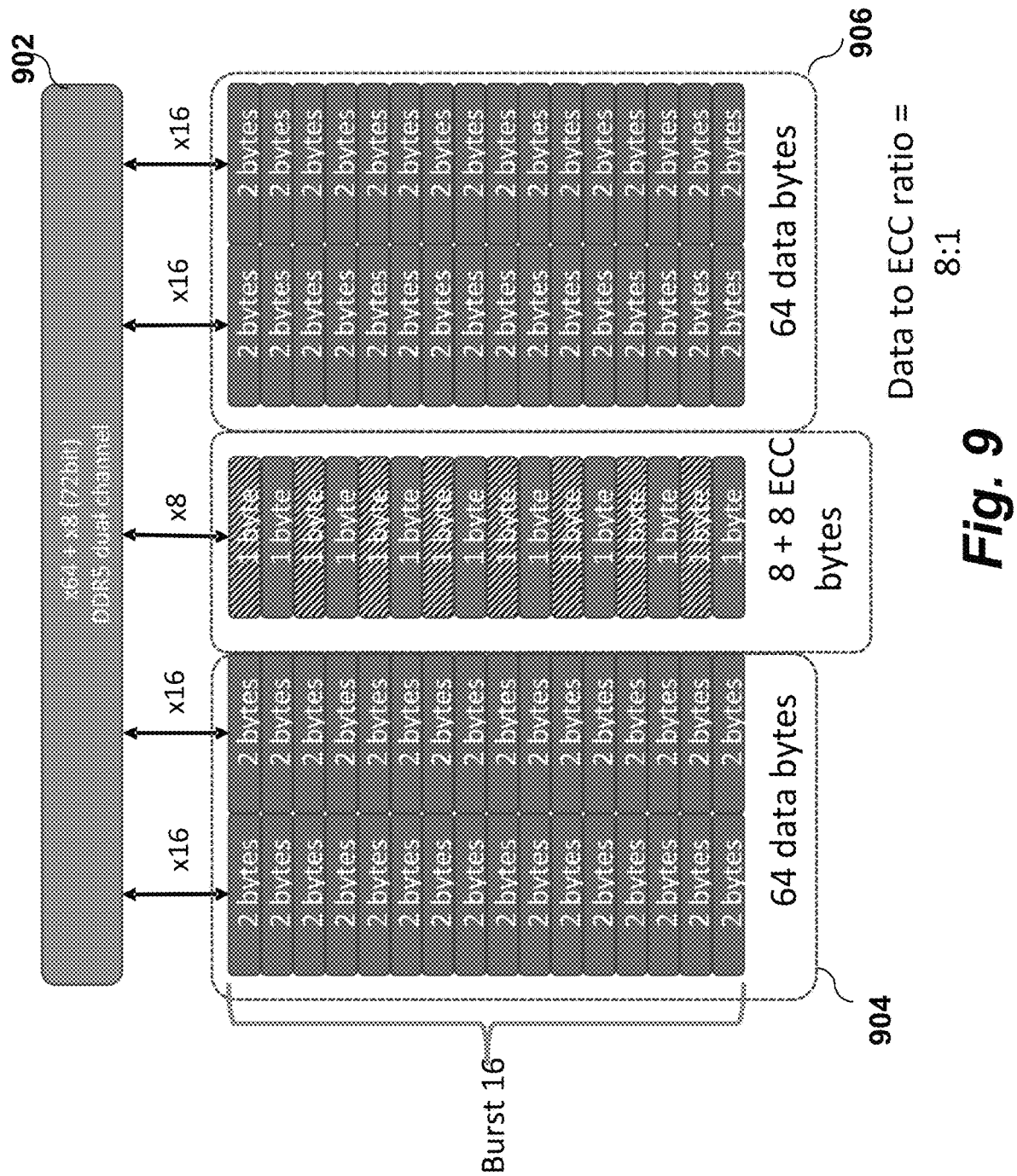
FIG. 9 illustrates an embodiment of an improved DDR5 dual-channel.

FIG. 9 illustrates an embodiment of an improved DDR5 dual-channel. The prefetch depth is 16 n, and the basic burst length is 16 words. However, instead of having two independent 40-bit DDR5 channels (see one 40-bit DDR5 traditional channel in FIG. 3), the improved DDR5 dual-channel is a 72-bit dual-channel 902.

In order to continue to allow for 64 byte accesses to match a cache line size of 64 bytes, memory controller 605 is configured to use a bus width of 72 bits, with 2× 32 data bits and 1× 8 ECC bits channel (see FIG. 9). Each of the 32-bits data channels (904 and 906) transfers 64 bytes of data in one burst, which is protected by its own eight ECC bytes. The 2× 32-bits data channels transfer a total of 128 bytes of data in one burst, which are protected by a total of 2*8=16 ECC bytes. The 2× 32-bits data channels (channel 904 and channel 906) are driven by the same clock signal in lockstep, transferring a block of 128 bytes of data at a time. To allow for independent commands, the address/control/command of channel 804 and channel 806 may be separated.

Because the eight ECC bytes corresponding to each of the 32-bit data channels are used to error correct the entire 64 bytes of data in one burst, as long as the eight ECC bytes are sent within the burst, the eight ECC bytes may be used to error correct the data without causing any delay. And since the two data channels (904 and 906) are driven by the same clock signal in lockstep, as long as the 16 ECC bytes corresponding to the 128 bytes of data are sent within the burst, error correction for both of the data channels may be performed without any delay. Therefore, the 16 ECC bytes corresponding to the 128 bytes of data may be sent in any order. For example, memory controller 605 may receive the combined 16 ECC bytes corresponding to channel 904 and channel 906 and organize the ECC bytes and send them out in a predetermined order.

In some embodiments, the 16 ECC bytes are interleaved. For example, as shown in FIG. 9, the eight ECC bytes corresponding to the left 32-bit data channel 904 (indicated by the shaded blocks) and the eight ECC bytes corresponding to the right 32-bit data channel 906 (indicated by the solid blocks) are interleaved together. The sending of the ECC bytes alternates between the two data channels. In particular, one ECC byte corresponding to the left 32-bit data channel 904 (indicated by a shaded block) is sent first, and one ECC byte corresponding to the right 32-bit data channel 906 (indicated by a solid block) is sent next, and a second ECC byte corresponding to the left 32-bit data channel 904 (indicated by a shaded block) is sent next, and then a second ECC byte corresponding to the right 32-bit data channel 906 (indicated by a solid block) is sent next, and so on.

FIG. 10 illustrates another embodiment of an improved DDR5 dual-channel. The eight ECC bytes corresponding to the left 32-bit data channel 1004 (indicated by the shaded blocks) are sent first, and then the eight ECC bytes corresponding to the right 32-bit data channel 1006 (indicated by the solid blocks) are sent next.

In some embodiments, four ECC bytes corresponding to the left 32-bit data channel are sent first, and then four ECC bytes corresponding to the right 32-bit data channel are sent next. Next, the remaining four ECC bytes corresponding to the left 32-bit data channel are sent, and then the remaining four ECC bytes corresponding to the right 32-bit data channel are sent.

As shown in FIG. 9 and FIG. 10, the ECC bytes are shown to be laid out in the middle of their respective 72-bit dual-channels (902 and 1002). However, it should be recognized that memory controller 605 may map the data bytes and the ECC bytes across the address space in different ways. The ECC bytes may be stored across multiple DRAMs. Memory controller 605 keeps track of how the data bytes and the ECC bytes are being mapped across the 72-bit dual-channel. Accordingly, when memory controller 605 reads from the DRAMs, memory controller 605 may separate the data bytes and the ECC bytes according to the predetermined mapping. In addition, memory controller 605 keeps track of the order in which the ECC bytes corresponding to the two 32-bit data channels are being sent or received. Accordingly, when memory controller 605 reads from the DRAMs, memory controller 605 may separate the ECC bytes corresponding to the first data channel from those corresponding to the second data channel according to the predetermined ordering. The ECC bytes corresponding to each 32-bit data channel may then be used by memory controller 605 to detect or correct the errors of the data bytes belonging to that data channel.

The benefit of the improved DDR5 dual-channel is that for every 64 bytes of data, the amount of ECC data is reduced from 16 ECC bytes (see FIG. 3) to eight ECC bytes (see FIGS. 9 and 10). In other words, comparing to the DDR5 traditional technique, the number of ECC bytes for every 64 bytes of data is reduced by half. The data to ECC ratio, i.e., the amount of actual data over the amount of ECC data, is increased from 4:1 to 8:1, which is the same as that for DDR4. The decreased ECC overhead reduces the cost and power consumption of server systems, which is beneficial when the extra ECC protection is not needed. Alternatively, for every 128 bytes of data, the amount of ECC data is 16 bytes. In other words, keeping the same number of 16 ECC bytes, the improved DDR5 dual-channel transfers twice the amount of data.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
    receiving a first set of 64 bytes of data and a second set of 64 bytes of data;
    calculating a first set of eight error-correcting code (ECC) bytes for the first set of 64 bytes of data and a second set of eight ECC bytes for the second set of 64 bytes of data; and
    sending the first set of 64 bytes of data, the second set of 64 bytes of data, the first set of eight ECC bytes, and the second set of eight ECC bytes to one or more synchronous dynamic random-access memory (SDRAM) modules through a dual-channel in a single burst, wherein the dual-channel comprises a first data channel for sending the first set of 64 bytes of data and a second data channel for sending the second set of 64 bytes of data, and wherein the first data channel and the second data channel are driven by a same clock signal, and wherein the dual-channel comprises a 72-bit wide dual-channel comprising the first data channel with a 32-bit width, the second data channel with a 32-bit width, and an ECC channel with an 8-bit width shared by the first data channel and the second data channel.

2. The method of claim 1, wherein the one or more synchronous dynamic random-access memory (SDRAM) modules comprise one or more 5$^{th}$ generation double data rate (DDR5) SDRAM, and wherein the dual-channel comprises a DDR5 dual-channel.

3. The method of claim 2, wherein the DDR5 dual-channel comprises a 72-bit wide DDR5 dual-channel.

4. The method of claim 2, wherein the first data channel and the second data channel of the DDR5 dual-channel are driven by the same clock signal in lockstep.

5. The method of claim 2, wherein the sending of the first set of 64 bytes of data, the second set of 64 bytes of data, the first set of eight ECC bytes, and the second set of eight ECC bytes to the one or more 5$^{th}$ generation double data rate (DDR5) synchronous dynamic random-access memory (SDRAM) modules through the DDR5 dual-channel has a burst length of 16 words.

6. The method of claim 2, wherein the first set of eight ECC bytes is used for error-correcting the entire first set of 64 bytes of data, and wherein the second set of eight ECC bytes is used to error correct the entire second set of 64 bytes of data.

7. The method of claim 6, wherein the sending of the first set of eight ECC bytes and the second set of eight ECC bytes is in a predetermined order, and wherein the predetermined order is used to separate the ECC bytes for error-correcting the first set of 64 bytes of data and the ECC bytes for error-correcting the second set of 64 bytes of data that are read from the one or more 5$^{th}$ generation double data rate (DDR5) synchronous dynamic random-access memory (SDRAM) modules.

8. The method of claim 6, wherein the sending of the first set of eight ECC bytes and the second set of eight ECC bytes is in a predetermined order, and wherein the sending alternates between the two sets of eight ECC bytes.

9. The method of claim 6, wherein the sending of the first set of eight ECC bytes and the second set of eight ECC bytes is in a predetermined order, and wherein the sending of the first set of eight ECC bytes is performed before the sending of the second set of eight ECC bytes.

10. A system, comprising:
a first interface, the first interface configured to receive a first set of 64 bytes of data and a second set of 64 bytes of data;
a processor, the processor configured to calculate a first set of eight error-correcting code (ECC) bytes for the first set of 64 bytes of data and a second set of eight ECC bytes for the second set of 64 bytes of data; and
a second interface, the second interface configured to send the first set of 64 bytes of data, the second set of 64 bytes of data, the first set of eight ECC bytes, and the second set of eight ECC bytes to one or more synchronous dynamic random-access memory (SDRAM) modules through a dual-channel in a single burst, wherein the dual-channel comprises a first data channel for sending the first set of 64 bytes of data and a second data channel for sending the second set of 64 bytes of data, and wherein the first data channel and the second data channel are driven by a same clock signal, and wherein the dual-channel comprises a 72-bit wide dual-channel comprising the first data channel with a 32-bit width, the second data channel with a 32-bit width, and an ECC channel with an 8-bit width shared by the first data channel and the second data channel.

11. The system of claim 10, wherein the one or more synchronous dynamic random-access memory (SDRAM) modules comprise one or more 5$^{th}$ generation double data rate (DDR5) SDRAM, and wherein the dual-channel comprises a DDR5 dual-channel.

12. The system of claim 11, wherein the DDR5 dual-channel comprises a 72-bit wide DDR5 dual-channel.

13. The system of claim 11, wherein the first data channel and the second data channel of the DDR5 dual-channel are driven by the same clock signal in lockstep.

14. The system of claim 11, wherein the sending of the first set of 64 bytes of data, the second set of 64 bytes of data, the first set of eight ECC bytes, and the second set of eight ECC bytes to the one or more 5$^{th}$ generation double data rate (DDR5) synchronous dynamic random-access memory (SDRAM) modules through the DDR5 dual-channel has a burst length of 16 words.

15. The system of claim 11, wherein the first set of eight ECC bytes is used for error-correcting the entire first set of 64 bytes of data, and wherein the second set of eight ECC bytes is used to error correct the entire second set of 64 bytes of data.

16. The system of claim 15, wherein the sending of the first set of eight ECC bytes and the second set of eight ECC bytes is in a predetermined order, and wherein the predetermined order is used to separate the ECC bytes for error-correcting the first set of 64 bytes of data and the ECC bytes for error-correcting the second set of 64 bytes of data that are read from the one or more 5$^{th}$ generation double data rate (DDR5) synchronous dynamic random-access memory (SDRAM) modules.

17. The system of claim 15, wherein the sending of the first set of eight ECC bytes and the second set of eight ECC bytes is in a predetermined order, and wherein the sending alternates between the two sets of eight ECC bytes.

18. A system, comprising:
a processor; and
a memory coupled with the processor, wherein the memory is configured to provide the processor with instructions which when executed cause the processor to:
receive via a first interface a first set of 64 bytes of data and a second set of 64 bytes of data;
calculate a first set of eight error-correcting code (ECC) bytes for the first set of 64 bytes of data and a second set of eight ECC bytes for the second set of 64 bytes of data; and
send via a second interface the first set of 64 bytes of data, the second set of 64 bytes of data, the first set of eight ECC bytes, and the second set of eight ECC bytes to one or more synchronous dynamic random-access memory (SDRAM) modules through a dual-channel in a single burst, wherein the dual-channel comprises a first data channel for sending the first set of 64 bytes of data and a second data channel for sending the second set of 64 bytes of data, and wherein the first data channel and the second data channel are driven by a same clock signal, and wherein the dual-channel comprises a 72-bit wide dual-channel comprising the first data channel with a 32-bit width, the second data channel with a 32-bit width, and an ECC channel with an 8-bit width shared by the first data channel and the second data channel.

19. The system of claim 18, wherein the one or more synchronous dynamic random-access memory (SDRAM) modules comprise one or more 5$^{th}$ generation double data rate (DDR5) SDRAM, and wherein the dual-channel comprises a DDR5 dual-channel.

20. The system of claim 19, wherein the first data channel and the second data channel of the DDR5 dual-channel are driven by the same clock signal in lockstep.

\* \* \* \* \*